(12) United States Patent
Patel et al.

(10) Patent No.: US 6,290,864 B1
(45) Date of Patent: Sep. 18, 2001

(54) FLUORIDE GAS ETCHING OF SILICON WITH IMPROVED SELECTIVITY

(75) Inventors: Satyadev R. Patel, Sunnyvale; Gregory P. Schaadt, Santa Clara; Douglas B. MacDonald, Los Gatos, all of CA (US)

(73) Assignee: Reflectivity, Inc., Santa Clara, CA (US)

( * ) Notice: Subject to any disclaimer, the term of this patent is extended or adjusted under 35 U.S.C. 154(b) by 0 days.

(21) Appl. No.: 09/427,841

(22) Filed: Oct. 26, 1999

(51) Int. Cl.$^7$ ....................................................... B81C 5/00

(52) U.S. Cl. ............................... 216/79; 216/73; 252/79.1

(58) Field of Search ............................. 252/79.1; 216/58, 216/73, 79

(56) References Cited

U.S. PATENT DOCUMENTS

| | | |
|---|---|---|
| 4,190,488 | 2/1980 | Winters . |
| 4,310,380 | 1/1982 | Flamm et al. . |
| 4,498,953 | 2/1985 | Cook et al. . |
| 4,740,410 | 4/1988 | Muller et al. . |
| 4,789,426 | 12/1988 | Pipkin . |
| 5,330,301 | 7/1994 | Brancher . |
| 5,534,107 | * 7/1996 | Gray et al. ........................ 156/643.1 |
| 5,672,242 | 9/1997 | Jen . |
| 5,716,495 | * 2/1998 | Butterbaugh et al. ............ 156/643.1 |
| 5,726,480 | 3/1998 | Pister . |
| 5,753,073 | 5/1998 | Jen . |
| 5,757,456 | * 5/1998 | Yamazaki et al. .................... 349/151 |
| 5,835,256 | 11/1998 | Huibers . |
| 6,051,503 | 4/2000 | Bhardwaj et al. . |

FOREIGN PATENT DOCUMENTS

| | | |
|---|---|---|
| 0822582 A2 | 2/1998 | (EP) . |
| 0822584 A2 | 2/1998 | (EP) . |
| 0838839 A2 | 4/1998 | (EP) . |
| 0878824 A2 | 11/1998 | (EP) . |
| WO 98/05605 | 2/1998 | (WO) . |
| WO 98/13856 | 4/1998 | (WO) . |
| 98/32163 | 7/1998 | (WO) . |
| WO 99/01887 | 1/1999 | (WO) . |
| WO 99/03313 | 1/1999 | (WO) . |
| 99/49506 | 9/1999 | (WO) . |
| 00/52740 | 9/2000 | (WO) . |

OTHER PUBLICATIONS

D.L. Flamm et al., *Solid State Technology* (Apr. 1983) 117–121.
U. Streller et al., *Applied Surface Science* (1996) 106: 341–346.
M.J.M. Vugts et al., *J. Vac. Sci. Technol. A* (Sep./Oct. 1996) 14(5): 2766–2774.
X–Q. Wang et al., *Transducers '97*, 1997 International Conference on Solid–State Sensors and Actuators, Chicago (Jun. 16–19, 1997) 1505–1508.
H.F. Winters, *J. Vac. Sci. Technol. B* (Oct–Dec. 1983) 1(4): 927–931.
H.F. Winters and J.W. Coburn, *Appl. Shys. Lett.* (Jan. 1979) 34(1): 70–73.

(List continued on next page.)

*Primary Examiner*—Frankie L. Stinson
*Assistant Examiner*—Allan Olsen
(74) *Attorney, Agent, or Firm*—Gregory R. Muir

(57) ABSTRACT

The etching of a sacrificial silicon portion in a microstructure such as a microelectromechanical structure by the use of etchant gases that are noble gas fluorides or halogen fluorides is performed with greater selectivity toward the silicon portion relative to other portions of the microstructure by the addition of non-etchant gaseous additives to the etchant gas. An additional discovery is that non-etchant gaseous additives that have a molar averaged formula weight that is below that of molecular nitrogen offer significant advantages over gaseous additives of higher formula weights by causing completion of the etch in a shorter period of time while still achieving the same improvement in selectivity.

38 Claims, 1 Drawing Sheet

OTHER PUBLICATIONS

J.M. Gildemeister, "Xenon Difluoride Etching System" (Nov. 17, 1997).

"Xenon Difluoride Isotropic Etch System," *Seeing is Believing*, Surface Technology Systems Ltd. brochure, Newport, UK (date unknown).

Assorted promotional literature, Surface Technology Systems Ltd., Newport, UK (Jul. 28, 1999).

Aliev et al., "Development of Si(100) Surface Roughness at Initial Stage of Etching in F2 and XeF2 Gases: Ellipsometric Study", Surface Science 442 (1999), 206–214.

Habuka et al., "Dominant Overall Chemical Reaction in a Chlorine Trifluoride–Silicon–Nitrogen System at Atmospheric Pressure", Japan Journal of Applied Physics vol. 38 (1999), pp. 6456–6469.

Hecht et al., "A Novel X–ray Photoelectron Spectroscopy Study of the Al/SIO2 Interface", J. Appl. Phys 57 (12), Jun. 15, 1985, pp. 5256–5261.

Houle, F.A., "Dynamics of SiF4 Desorption During Etching of Silicon by XeF2", IBM Almaden Research Center, Apr. 15, 1987, pp. 1886–1872.

Ibbotson et al., "Plasmaless Dry Etching of Silicon with Fluorine–containing compounds", Journal of Applied Physics, vol. 56, No. 10, Nov. 15, 1984, pp. 2939–2942.

Ibbotson et al., "Comparison of XeF2 and F–atom Reactions with Si and SiO2", Applied Physics Letter, vol. 44, 1129 (1984).

XACTIX, Inc., Marketing Brochure, Jun. 27, 1999.

\* cited by examiner-

FLUORIDE GAS ETCHING OF SILICON WITH IMPROVED SELECTIVITY

BACKGROUND OF THE INVENTION

1. Field of the Invention

This invention lies in the technology of the manufacture of micro-structures, which include such devices as microelectromechanical structures and semiconductor devices. In particular, this invention addresses gas-phase etching procedures, focusing on those involving the etching of silicon by noble gas fluorides, halogen fluorides, or both, all in the gas phase.

2. Description of the Prior Art

The use of selective etchants to remove sacrificial layers or regions in a multilayer structure without removal of an adjacent layer or region is a necessary and common step in the manufacture of semiconductor devices and microelectromechanical structures (MEMS). MEMS have found applications in inertial measurement, pressure sensing, thermal measurement, micro-fluidics, optics, and radio-frequency communications, and the range of possibilities for these structures continues to grow. One example of such a structure is a reflective spatial light modulator, which is a device consisting of a planar array of electrostatically deflectable mirrors, each microscopic in size. The device is used as a microdisplay system for high-resolution, large-screen projection. The sacrificial layer in such a device is the layer over which the mirror material is deposited. Once the mirror structure is formed, the sacrificial layer is removed to leave gaps below the mirrors and a microhinge along one edge of each mirror to join the mirror to the remainder of the structure. The gap and the microhinge provide the mirror with the freedom of movement needed for its deflection. Devices of this type are described in U.S. Pat. No. 5,835,256 (issued Nov. 10, 1998, to Andrew Huibers, assignor to Reflectivity, Inc.). The contents of this patent are incorporated herein by reference.

The success of a manufacturing procedure for structures involving sacrificial layers depends on the selectivity of the etching process. The thicknesses and lateral dimensions of the layers, and in the case of the deflectable mirror structures the width of the gap and the integrity of the microhinges, are all critical to achieving uniform microstructure properties and a high yield of defect-free product. A factor in meeting this criticality is the quality of the etch. Performance, uniformity and yield can all be improved with increases in the etch selectivity of the sacrificial layer relative to the adjacent functional layers. Selectivity is important in both isotropic and anisotropic etching procedures. Isotropic etching is of particular interest, however, in structures where the sacrificial layer is an intervening layer between functional layers or between a functional layer and a substrate, since the bulk of the sacrificial layer in these structures is accessible to the etchant only through vias in the functional layer and etchant must proceed laterally outward from the vias. The structures described in U.S. Pat. No. 5,835,256 above require isotropic etchant for this reason. The "vias" in these structures are the narrow gaps between the facing edges of adjacent mirror elements or between a mirror edge and an adjacent feature.

Among the etchants that are used for the removal of sacrificial layers or regions in both isotropic and anisotropic etching procedures are noble gas fluorides and halogen fluorides. These materials, used in the gas phase, selectively etch silicon relative to other materials such as silicon-containing compounds, metallic elements, and compounds of metallic elements. The selectivity is not infinite, however, and can vary widely with the equipment, process, materials and reaction conditions. Xenon difluoride, for example, has demonstrated selectivities as high as 400:1 to 500:1, but any improvement in this ratio would significantly benefit the cost and reliability of the products manufactured.

SUMMARY OF THE INVENTION

It has now been discovered that the selectivity of the etching of silicon relative to other materials in a microstructure by use of an etchant gas which is either a noble gas fluoride, halogen fluoride, or a combination of the two can be increased significantly by using as the etching medium a gas mixture containing the etchant gas(es) and one or more of certain additional but non-etchant gaseous components. It has further been discovered that while the inclusion of non-etchant gaseous additives causes prolongation of the etch time, those additives whose molar-averaged formula weight is below that of nitrogen gas prolong the etch time to a much lesser extent than do those whose molar-averaged formula weight is equal to or greater than that of molecular nitrogen, while still achieving the same improvement in selectivity. The improvement in selectivity is achievable independently of the partial pressure of the etchant gas in the gas mixture. Likewise, the limitation on the increase in etch time when the averaged formula weight of the additive gas is less than that of molecular nitrogen is achievable independently of the partial pressure of the etchant gas in the gas mixture. Both the increase in selectivity and the limitation on the etch time are sufficiently great that significant improvements in uniformity, yield, and product reliability are achieved.

These discoveries offer numerous advantages, for example in overetching, i.e., etching purposely done to a degree beyond that which is strictly required for removal of the sacrificial silicon. Since the high selectivity allows one to overetch without introducing nonuniformity across the mirror array, this invention permits the use of overetching as a convenient and effective means of assuring complete removal of the sacrificial silicon while still preserving the integrity of the mirror elements. The invention thus eases the requirement for precise endpoint detection, i. e., precise detection of the point at which the last of the sacrificial silicon is removed. Another advantage stems from the dilution effect of the additive gas. Dilution improves the circulation of the gaseous mixture through the system by adding to the mass that flows through the recirculation system or agitator when such pieces of equipment are present. Also, the presence of the additive gas helps reduce high local concentrations of the etchant at the sample surface. Each of these factors improves microstructure uniformity and yield.

This invention is of particular interest in etching processes that are not performed in a plasma environment, i.e., etching processes performed without the use of externally imposed energy such as ultraviolet light or high frequency electromagnetic energy to excite the gases into a plasma state. The invention is also of particular interest in isotropic etching processes, notably those in which the silicon and the non-silicon portions (as defined below) of the microstructure are overlapping layers, coextensive or otherwise, or nonoverlapping layers, sharing a common boundary or separated but still simultaneously exposed to the etchant gas. The invention is particularly useful in structures in which the silicon is a layer positioned underneath a layer of the non-silicon material such that removal of the silicon by etching requires lateral access through vias in the non-silicon layer. The invention is also of particular interest in the manufacture of reflective spatial light modulators of the type described in U.S. Pat. No. 5,835,256, in which the mirror elements are formed of silicon nitride or silicon dioxide and the underlying sacrificial layer serving as the support to be removed by etching is polysilicon.

BRIEF DESCRIPTION OF THE DRAWING

The drawing accompanying this specification is a diagram of an apparatus, used herein for experimentation, in which polysilicon is selectively etched from a microstructure containing both polysilicon and silicon nitride layers, by use of the method of this invention.

DETAILED DESCRIPTION OF THE INVENTION AND PREFERRED EMBODIMENTS

Figure 1:
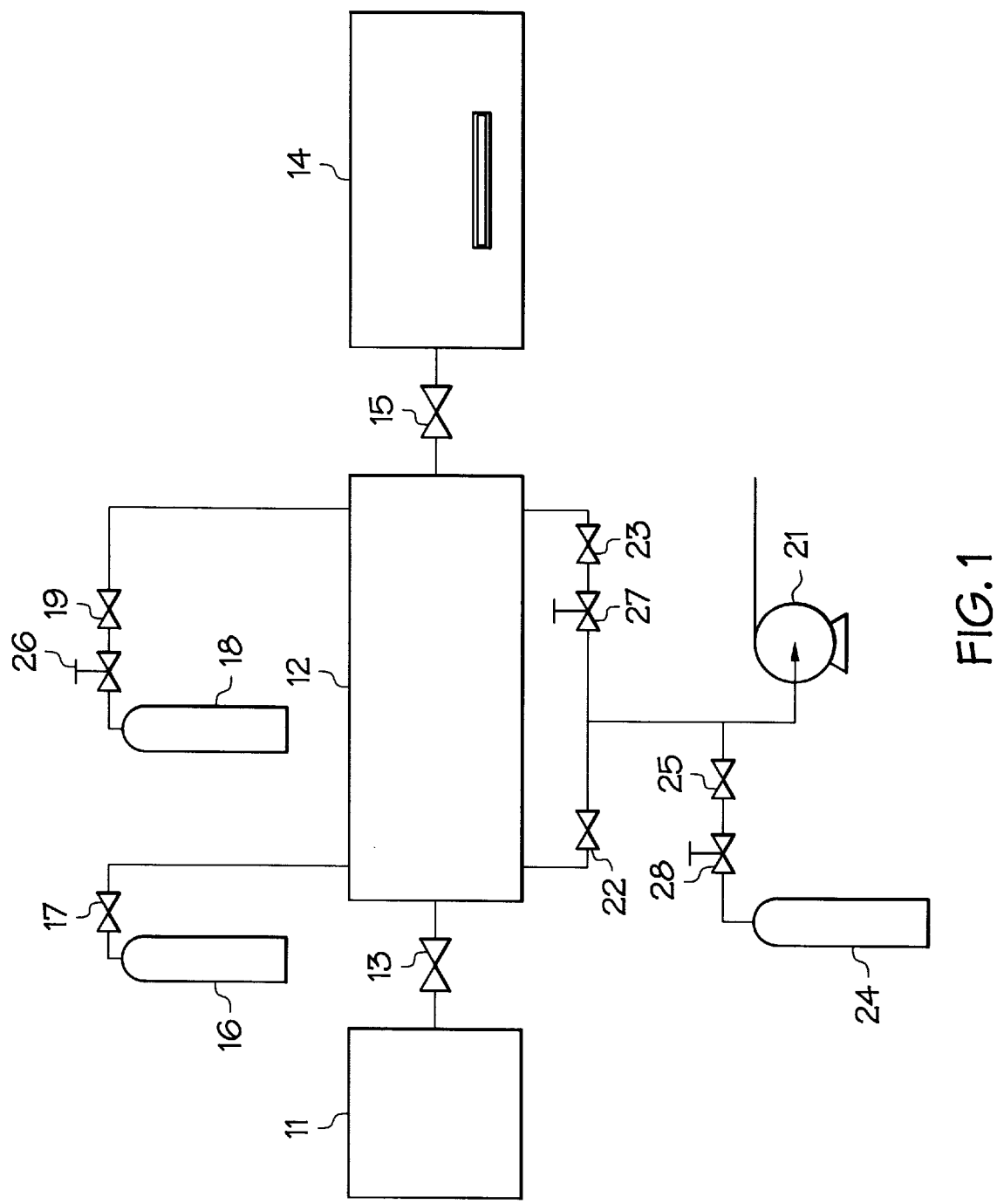

Etching processes addressed by this invention are those in which the etchant is one or more gaseous noble gas fluorides, one or more gaseous halogen fluorides, or combinations of gaseous noble gas fluorides and halogen fluorides. The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest.

The gas mixture is preferably contacted with the sample at a pressure below atmospheric pressure. The term "sample" is used herein to denote the article from which the sacrificial silicon is sought to be removed in a selective manner relative to other materials which may reside in separate layers or regions of the article. The "sample" may thus be a single mirror element and its associated layers of other materials, a test pattern, a die, a device, a wafer, a portion of a wafer, or any article containing sacrificial silicon. While the rate of the etching reaction may vary with the partial pressure of the etchant gas, the partial pressure is generally not critical to the invention and may vary. In most applications, best results will be obtained with the etchant gas at a partial pressure of at least about 0.1 mbar (0.075 torr), preferably at least about 0.3 mbar (0.225 torr), more preferably within the range of from about 0.3 mbar (0.225 torr) to about 30 mbar (22.5 torr), and most preferably from about 1 mbar (0.75 torr) to about 15 mbar (11.25 torr). These pressure ranges are particularly applicable to xenon difluoride.

The gaseous additive that is included in the gas mixture to increase the selectivity of the silicon etch is a gas that is not itself active as an etching agent, and preferably a non-halogen-containing gas. The additive may be a single species or a mixture of species. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K. (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen ($N_2$, formula weight: 28; thermal conductivity at 300 K: 26 mW/(m K)), argon (Ar, formula weight: 40; thermal conductivity at 300 K: 18 mW/(m K)), helium (He, formula weight: 4; thermal conductivity at 300 K: 160 mW/(m K)), neon (Ne, formula weight: 20; thermal conductivity at 300 K: 50 mW/(m K)), and mixtures of two or more of these gases. For embodiments in which the molar-averaged formula weight is below that of molecular nitrogen, the preferred additive gas is helium, neon, mixtures of helium and neon, or mixtures of one or both with one or more of higher formula weight non-etchant gases such as nitrogen and argon. Particularly preferred additives are helium and mixtures of helium with either nitrogen or argon.

The degree of selectivity improvement may vary with molar ratio of the additive to the etchant gas, but this ratio is generally not critical to the utility of this invention. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 100:1.

The temperature at which the etch process is conducted is likewise not critical to this invention. The temperature does however affect the partial pressure of the etchant gas and the optimal temperature may depend on the choice of etchant gas, gaseous additive or both. In general, and particularly for procedures using xenon difluoride as the etchant gas, suitable temperatures will range from about −60° C. to about 120° C. preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The duration of the exposure of the sample to the gas mixture in the practice of this invention will be the amount of time sufficient to remove all of the silicon or substantially all, i.e., any amount sufficient to permit the microstructure to function essentially as effectively as if all of the silicon had been removed. An advantage of the high selectivity achieved with this invention is that it permits overetching of the silicon without significant loss of the non-silicon material. The time required for the etching process will vary with the amount of silicon to be removed and the dimensions and geometry of the silicon layer, and is not critical to this invention. In most cases, best results will be achieved with an exposure time lasting from about 30 seconds to about 30 minutes, preferably from about 1 minute to about 10 minutes. An example of the structures to which this invention will be applied is that depicted in U.S. Pat. No. 5,835,256, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers).

In certain procedures within the scope of this invention, the manner and the order in which the gases in the gas mixture are combined may have an effect on the quality of the finished product. Variations may thus be introduced in the order of combining the etchant gas with the non-etchant diluent or whether this is done in portions, or, when two or more non-etchant diluents are used, the decision to combine one diluent with the etchant gas before adding the other diluent, or which diluent or subcombination is the first to contact the sample. Such variations may affect parameters of the process such as the diffusion time, the reaction rate at the surface of the sample, and the rate of removal of reaction products from the surface.

The sacrificial silicon layers to which this invention is applicable may be crystalline silicon, amorphous silicon, partially crystalline silicon, crystalline silicon of multiple crystal sizes, polysilicon in general, and silicon doped with such dopants as arsenic, phosphorus or boron. Polysilicon is of particular interest, although the relative crystalline vs. amorphous character of polysilicon will vary considerably with the deposition conditions, the presence or absence of dopants and impurities, and the degree of annealing.

The term "non-silicon" as used herein denotes any material that does not contain either amorphous or crystalline silicon in any of the forms described in the preceding paragraph. The term thus includes silicon-containing compounds in which elemental silicon is bonded to another element, as well as non-silicon elements and compounds of non-silicon elements. Examples of such non-silicon materials are titanium, gold, tungsten, aluminum, and compounds of these metals, as well as silicon carbide, silicon nitride, and silicon oxides. Silicon nitride and silicon oxide are of particular interest in view of their use in the structures disclosed in U.S. Pat. No. 5,835,256. Two or more different non-silicon materials may be present in a single structure, and selectivity of the silicon etch relative to all such non-silicon materials will be improved.

The thickness and lateral dimensions of the layers are also noncritical to the improvement in selectivity achieved by this invention. In most cases, the silicon portion will be a layer having a thickness of from about 200 nm to about 5,000 nm, preferably from about 250 nm to about 3,000 nm, and most preferably from about 300 nm to about 1,000 nm. Similarly, in most cases the non-silicon portion will be a layer with a thickness of from about 10 nm to about 500 nm, preferably from about 20 nm to about 200 nm, and most preferably from about 30 nm to about 200 nm. The lateral distance that the etching process must extend under the typical silicon nitride mirror element in the structures of U.S. Pat. No. 5,835,256 in order to remove all of the underlying polysilicon (this distance typically being half the shortest lateral dimension of the mirror when the etching front travels inward from opposing edges) may range from a submicron distance to about 100 microns, preferably from about 3 microns to about 30 microns, and most preferably from about 5 microns to about 15 microns.

The following examples are offered as further illustration of the invention and are not intended to impose limits on the scope of the invention.

EXAMPLES

Etching experiments were performed in the apparatus depicted in the attached drawing. The apparatus included a source chamber 11 containing xenon difluoride crystals maintained at a temperature of 28.5° C. at which temperature the sublimation pressure of the crystals is 5–11 mbar (4–8 torr), an expansion chamber 12 having a volumetric capacity of 29 cubic inches (0.46 liter) to receive xenon difluoride gas from the source chamber 11, with a shutoff valve 13 joining these two chambers, an etch chamber 14 having a volumetric capacity of 12 cubic inches (0.18 liter) to contain the sample microstructure to be etched, the etch chamber 14 fed by the expansion chamber 12 through a further shutoff valve 15. Also included in the apparatus is a first gas source 16 communicating with the expansion chamber 12 through a further shutoff valve 17, a second gas source 18 communicating with the expansion chamber through a separate shutoff valve 19, a vacuum pump 21 and associated shutoff valves 22, 23 to control the evacuation of the chambers, a third gas source 24 serving as a pump ballast with an associated shutoff valve 25 to prevent backstreaming from the pump 21, and manually operated needle valves 26, 27, 28 to set the gas flow rates through the various lines and to permit fine adjustments to the pressures in the chambers. The expansion chamber 12 and the etch chamber 14 were both maintained at a temperature of 35.0° C., while different gases were placed in the first and second gas sources for the various experiments.

Although not shown in the drawing, the apparatus may be varied to improve the sample uniformity and reduce the total etch time (by actively moving reaction products away from etch sites and replenishing the etch site with reactant) by placing an agitator in the etch chamber 14, by including a circulation line between the etch and expansion chambers with a pump in the line to circulate the gas mixture through the etch chamber 14 and the expansion chamber 12, or by using both of these methods.

The general procedure followed in these experiments began with the evacuation of both the expansion chamber 12 and the etch chamber 14, followed by venting both chambers to atmospheric pressure with gas from the first gas source 16 by opening the two shutoff valves 17, 15, between this gas source and the two chambers. The sample was then placed in the etch chamber 14 (with the shutoff valves 7, 15 open during the sample insertion) which was then sealed, and both the expansion chamber 12 and the etch chamber 14 were evacuated. All valves were then closed.

The connecting valve 15 between the expansion chamber 12 and the etch chamber 14 was opened, and the shutoff valve 17 at the outlet of the first gas source 16 was opened briefly to allow the gas from the first gas source to enter the expansion and etch chambers to a pressure of about 630 mbar (470 torr). The shutoff valve 17 was then closed. The connecting valve 15 was then closed, and the expansion chamber 12 was evacuated and isolated. The supply valve 13 from the xenon difluoride source chamber 11 was then opened to allow xenon difluoride gas to enter the expansion chamber to a pressure above 8 mbar (6 torr) (due to the higher temperature of the expansion chamber). The supply valve 13 was then closed, outlet valve 23 was opened, and the needle valve 27 was opened slightly to lower the xenon difluoride pressure in the expansion chamber to 6.7 mbar (5 torr). Both the outlet valve 23 and the needle valve 27 were then closed. The shutoff valve 19 at the second gas source 18 was then opened and with the assistance of the needle valve 26, gas from the second gas source was bled into the expansion chamber to a pressure of about 27 mbar (20 torr). At this point the expansion chamber 12 contained xenon difluoride at 7 mbar (5 torr) plus gas from the second gas source 18 at 20 mbar (15 torr), while the etch chamber 14 contained gas from the first gas source at 630 mbar (470 torr).

The connecting valve 15 between the expansion chamber 12 and the etch chamber 14 was then opened to allow the gas mixture from the expansion chamber to enter the etch chamber as the gases from the two chambers became mixed and distributed between the chambers, thereby beginning the etch process. The etch chamber thus contained xenon difluoride at a partial pressure of 4.7 mbar (3.5 torr) gas from the first gas source at a partial pressure of 180 mbar (140 torr) and gas from the second gas source at a partial pressure of 14 mbar (11 torr), thereby resulting in a (second gas):(first gas):(xenon difluoride) volume ratio of 3:39:1. The etch process was continued for as long as needed to remove all of the polysilicon layer, as determined visually, then discontinued.

The sample being etched consisted of a layered structure formed on a quartz plate measuring 11.3 mm×15.6 mm. The first layer was a continuous polysilicon layer deposited directly on one side of the quartz, and the second layer was patterned silicon nitride deposited directly over the polysilicon layer. The polysilicon layer measured 9.2 mm×12.3 mm in lateral dimensions and was centered on the quartz surface, thereby leaving border regions along all four sides, and had a thickness of 0.5 micron. The silicon nitride layer was 249 nm (0.249 micron) in thickness and was coextensive with the quartz plate, thereby extending over both the underlying polysilicon layer and the border regions where no polysilicon had been deposited. The silicon nitride layer was patterned to form an array of square mirrors measuring 12 microns on each side with each pair of adjacent mirrors separated by a via 0.8 micron in width to expose the underlying polysilicon. Measurements of the thickness of the silicon nitride layer to assess the selectivity of the polysilicon etch were performed at four locations in the border regions, close to the four corners of the quartz plate, these locations being spaced apart from the edge of the polysilicon layer by distances greater than 300 microns. This distance was chosen to assure, for purposes of uniformity, that the measurement locations experienced no temperature rise from the exothermic polysilicon etch reaction, since the thermally insulating nature of silicon nitride precluded any such temperature rise at locations beyond approximately 100 microns from the edge of the polysilicon layer.

The time required for full removal of the polysilicon layer was determined by visual observation, as indicated above. The thickness of the silicon nitride at the measurement locations was determined both before and after the polysilicon etching by a common industry method of thin-film measurement using the reflectance of the film (as used in the NanoSpec Thin Film Measurement System of Nanometrics, Inc., Sunnyvale, Calif. USA, and in the Advanced Thin Film Measurement Systems of Filmetrics, Inc., San Diego, Calif. USA). Measurements were performed on two or three samples for each experiment, and the results averaged. The results are listed in the table below, which include as the first experiment a control run with xenon difluoride alone and no additive.

| | | | | | |
|---|---|---|---|---|---|
| | | | | Experimental Results | |
| Experiment No. | No. of Samples | Gas in 1st Gas Source | Gas in 2d Gas Source | Time Required for Removal of Polysilicon | $Si_3N_4$ Thickness Loss (Initial Thickness 249 nm) During Polysilicon Removal |
| I | 3 | none | none | 65 sec | 11–13 nm |
| II | 3 | $N_2$ | $N_2$ | 610 sec | 2–3 nm |
| III | 2 | Ar | Ar | 590 sec | 2–3 nm |
| IV | 2 | He | He | 250 sec | 2–3 nm |

With the etching of the underlying polysilicon layer in the lateral direction, the etching distance of the polysilicon was one-half the width of each mirror element, or 0.5×12 microns=6,000 nm. The results in the table indicate that the selectivity of the etch of polysilicon relative to silicon nitride rose from approximately 500:1 (6,000 nm:11 nm) with the xenon difluoride-only etch medium in Experiment I to approximately 2,000:1 (6,000 nm:3 nm) with the addition of each of the additive gases in Experiments II, III and IV, and that the increase in etch time of the polysilicon when the additive was helium (Experiment IV) was well under half the attendant increases when the additives were nitrogen and argon, both of which had formula weights exceeding 25.

The foregoing description and examples are offered primarily for purposes of illustration. It will be readily apparent to those skilled in the art that numerous modifications and variations beyond those described herein can be made while still falling within the spirit and scope of the invention.

What is claimed is:

1. In a method for selectively etching a silicon portion relative to a non-silicon portion of a sample containing both silicon and non-silicon portions, said non-silicon portion consisting of a member selected from the group consisting of a non-silicon metal, a compound of a non-silicon metal, and a silicon-containing compound in which silicon is bonded to a non-silicon element, by exposing both said silicon portion and said non-silicon portion to an etchant gas selected from the group consisting of noble gas fluorides and halogen fluorides, the improvement in which said etchant gas is utilized in the form of a gas mixture in which said etchant gas is mixed with a non-etchant gaseous additive, the partial pressure of said etchant gas in said gas mixture being at least about 0.1 mbar, and the molar ratio of said non-etchant gaseous additive to said etchant gas being from about 1:1 to about 500:1, such that said gas mixture achieves greater etching selectivity toward said silicon portion than would be achieved with said etchant gas alone.

2. A method in accordance with claim 1 in which said non-etchant gaseous additive has a molar-averaged formula weight of less than about 25.

3. A method in accordance with claim 1 in which said non-etchant gaseous additive has a molar-averaged formula weight of from about 4 to about 25.

4. A method in accordance with claim 1 in which said non-etchant gaseous additive has a molar-averaged formula weight of from about 4 to about 20.

5. A method in accordance with claim 1 in which said non-etchant gaseous additive has a molar-averaged formula weight of from about 4 to about 10.

6. A method in accordance with claim 1 in which said non-etchant gaseous additive has a molar-averaged thermal conductivity at 300 K and atmospheric pressure of from about 10 mW/(m K) to about 200 mW/(m K).

7. A method in accordance with claim 1 in which said non-etchant gaseous additive has a molar-averaged thermal conductivity at 300 K and atmospheric pressure of from about 140 mW/(m K) to about 190 mW/(m K).

8. A method in accordance with claim 1 in which said molar ratio is from about 10:1 to about 200:1.

9. A method in accordance with claim 1 in which said molar ratio is from about 20:1 to about 100:1.

10. A method in accordance with claim 1 in which said non-etchant gaseous additive is a member selected from the group consisting of nitrogen, argon, helium, neon, and mixtures thereof.

11. A method in accordance with claim 1 in which said non-etchant gaseous additive is a member selected from the group consisting of helium, neon, mixtures of helium and neon, and mixtures of one or both of helium and neon with one or both of nitrogen and argon.

12. A method in accordance with claim 1 in which said non-etchant gaseous additive is a member selected from the group consisting of helium, a mixture of helium and nitrogen, and a mixture of helium and argon.

13. A method in accordance with claim 1 in which said non-etchant gaseous additive is a member selected from the group consisting of helium and a mixture of helium and nitrogen.

14. A method in accordance with claim 1 in which said non-etchant gaseous additive is helium.

15. A method in accordance with claim 1 in which said etchant gas is a noble gas fluoride.

16. A method in accordance with claim 15 in which said noble gas fluoride is a member selected from the group consisting of krypton difluoride and the xenon fluorides.

17. A method in accordance with claim 15 in which said noble gas fluoride is a member selected from the group consisting of xenon difluoride, xenon tetrafluoride, and xenon hexafluoride.

18. A method in accordance with claim 15 in which said noble gas fluoride is xenon difluoride.

19. A method in accordance with claim 15 in which said noble gas fluoride is xenon difluoride and said non-etchant gaseous additive is a member selected from the group consisting of helium, neon, and mixtures one or more or helium and neon with one or more of nitrogen and argon.

20. A method in accordance with claim 15 in which said noble gas fluoride is xenon difluoride and said non-etchant gaseous additive is a member selected from the group consisting of helium and a mixture of nitrogen and helium.

21. A method in accordance with claim 1 in which said etchant gas is a halogen fluoride.

22. A method in accordance with claim 21 in which said halogen fluoride is a member selected from the group consisting of chlorine trifluoride, bromine trifluoride, and iodine pentafluoride.

23. A method in accordance with claim 21 in which said halogen fluoride is a member selected from the group consisting of chlorine trifluoride and bromine trifluoride.

24. A method in accordance with claim 21 in which said halogen fluoride is bromine trifluoride.

25. A method in accordance with claim 1 in which the partial pressure of said etchant gas is from about 0.3 mbar to about 30 mbar.

26. A method in accordance with claim 1 in which the partial pressure of said etchant gas is from about 1 mbar to about 15 mbar.

27. A method in accordance with claim 1 in which the partial pressure of said etchant gas is from about 1 mbar to about 15 mbar, and the mole ratio of said non-etchant gaseous additive to said etchant gas is from about 10:1 to about 200:1.

28. A method in accordance with claim 1 in which the partial pressure of said etchant gas is from about 1 mbar to about 15 mbar, and the mole ratio of said non-etchant gaseous additive to said etchant gas is from about 20:1 to about 100:1.

29. A method in accordance with claim 1 in which said non-silicon portion is a member selected form the group consisting of non-silicon metals and compounds of non-silicon metals.

30. A method in accordance with claim 29 in which said non-silicon portion is a member selected from the group consisting of titanium, gold, tungsten, and compounds thereof.

31. A method in accordance with claim 29 in which said non-silicon portion is gold.

32. A method in accordance with claim 1 in which said silicon portion is a silicon layer deposited over a substrate and said non-silicon portion is a layer of a member selected from the group consisting of silicon nitride, silicon carbide, and silicon oxide deposited over said silicon layer, said non-silicon layer being patterned to leave vias therein for access of said gas mixture to said silicon layer, the exposure to said gas mixture being of sufficient duration to laterally etch away substantially all of said silicon layer by access through said vias.

33. A method in accordance with claim 1 in which said silicon layer is a polysilicon layer deposited over a substrate and said non-silicon portion is a layer of silicon nitride, said silicon nitride layer being patterned to leave vias therein for access of said gas mixture to said polysilicon layer, said exposure to said gas mixture being of sufficient duration to laterally etch away substantially all of said polysilicon layer by access through said vias.

34. A method in accordance with claim 33 in which said polysilicon layer is from about 200 nm to about 5000 nm in thickness.

35. A method in accordance with claim 33 in which said polysilicon layer is from about 250 nm to about 3000 nm in thickness.

36. A method in accordance with claim 33 in which said polysilicon layer is from about 300 nm to about 1000 nm in thickness.

37. A method in accordance with claim 33 in which said silicon nitride layer is from about 10 nm to about 500 nm in thickness.

38. A method in accordance with claim 33 in which said silicon nitride layer is from about 20 nm to about 200 nm in thickness.

* * * * *